United States Patent
Weiss et al.

(10) Patent No.: US 7,314,829 B2
(45) Date of Patent: Jan. 1, 2008

(54) METHOD AND APPARATUS FOR POLYSILICON RESISTOR FORMATION

(75) Inventors: Martin N. Weiss, Portland, OR (US); Kirsten H. Thompson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/919,541

(22) Filed: Aug. 16, 2004

(65) Prior Publication Data

US 2006/0035426 A1   Feb. 16, 2006

(51) Int. Cl.
*H01L 21/44* (2006.01)
*H01L 21/425* (2006.01)

(52) U.S. Cl. ............... 438/682; 438/514; 257/E21.006

(58) Field of Classification Search ............... 438/238, 438/299, 382, 510, 514, 530, 682; 257/E21.006, 257/E21.151, E21.165, E21.199, E21.622, 257/E21.636
See application file for complete search history.

(56) References Cited

U.S. PATENT DOCUMENTS 4,897,368 A * 1/1990 Kobushi et al. ............ 438/592
5,956,617 A * 9/1999 Kimura et al. ............. 438/682

OTHER PUBLICATIONS

Morimoto et al., "A NiSi Salicide Technology for Advanced Logic Devices", IEEE, Apr. 1999, vol. 35, No. 7.

Ohguro et al., "Nitrogen doped nickel monosilicide technique for deep submicron CMOS salicide", IEEE, 1995, pp. 18.3.1-18.3.4.
Lee et al, "Improved NiSi Salicide Process Using Presilicide N+2 Implant for MOSFETs", IEEE, Dec. 2000, vol. 21, No. 12, pp. 566-568.
William et al., "The Design of Thin Film Polysilicon Resistors for Analog IC Applications", IEEE, Apr. 1989, vol. 36, No. 4, pp. 738-744.
Babcock et al., "Precision Electrical Trimming of Very Low TCR Poly-SiGe Resistors", IEEE, Jun. 2000, vol. 21, No. 6, pp. 283-285.
Lee et al., "Optimization of Boron Doped Ploysilicon Resistors", J. Electrochem. Soc., vol. 128, No. 6, Jun. 1981, pp. 659-661.
Chen et al., "Nitrogen Implanted Polysilicon Resistor for High-Voltage CMOS Technology Application", IEEE, Nov. 2001, vol. 22, No. 11, pp. 524-526.
Saito et al., "A Novel Scaled-Down Oxygen-Implanted Polysilicon Resistor for Future Static RAM's", IEEE, Mar. 1988, vol. 35, No. 3, pp. 298-301.
Kumar et al., "Modeling of Polycrystalline Silicon Thermal Coefficient of Resistance", IEEE, Poster Presentations, 1999.
Rydberg et al., "Long-term stability and electrical properties of fluorine doped polysilicon IC-resistors", Elsevier Science Ltd., 2001, pp. 373-382.
Liu et al., "Characterization of Polysilicon Resistors in Sub-0.25 um CMOS ULSI Applications", IEEE, Jul. 2001, vol. 22, No. 7, pp. 318-320.

(Continued)

*Primary Examiner*—Scott B. Geyer
(74) *Attorney, Agent, or Firm*—David L. Guglielmi

(57) ABSTRACT

Some embodiments of the present invention include implanting and annealing polysilicon lines to form a silicide blocking layer that may inhibit silicide formation. The silicide blocking layer may facilitate fabrication of polysilicon resistors.

12 Claims, 5 Drawing Sheets

OTHER PUBLICATIONS

Cheng et al., "Effects of nitrogen ion implanatation on the formation of nickel silicide contacts on shallow junctions", Elsevier Science, 1999, pp. 412-416.

Rodder, Mark, "Effects of Channel Width and Parasitic Bipolar Action on p-Type Poly-Si Resistor Characteristics", IEEE, May 1991, vol. 12, No. 5, pp. 241-243.

D.W. Lee et al., "Fabrication Technology of Polysilicon Resistors Using Novel Mixed Process for Analogue CMOS Applications", Electonics Letters Apr. 1, 1999 vol. 35 No. 7.

* cited by examiner

METHOD AND APPARATUS FOR POLYSILICON RESISTOR FORMATION

TECHNICAL FIELD

The invention relates to semiconductor technology. In particular, the present invention relates to methods and apparatus for polysilicon resistor formation.

BACKGROUND

In semiconductor processing, polysilicon features may be patterned on a semiconductor wafer surface. Subsequent silicide formation on the polysilicon features may cause them to become conductive. Prior to silicide formation, the polysilicon features may be resistive.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, an apparatus and method relating to the formation of polysilicon resistors are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Formation of a silicide layer on a polysilicon resistor may cause its electrical resistance to become sufficiently low such that the structure is no longer useful as a resistor. Briefly, the present method may include forming a silicide blocking layer in a polysilicon line to block subsequent silicide formation. More specifically, atoms may be selectively implanted into the polysilicon line and the polysilicon line may be annealed. Consequently, the polysilicon at the surface of the polysilicon line may react with the implanted atoms and subsequent silicide formation may then be inhibited in the polysilicon line.

Figure 1:
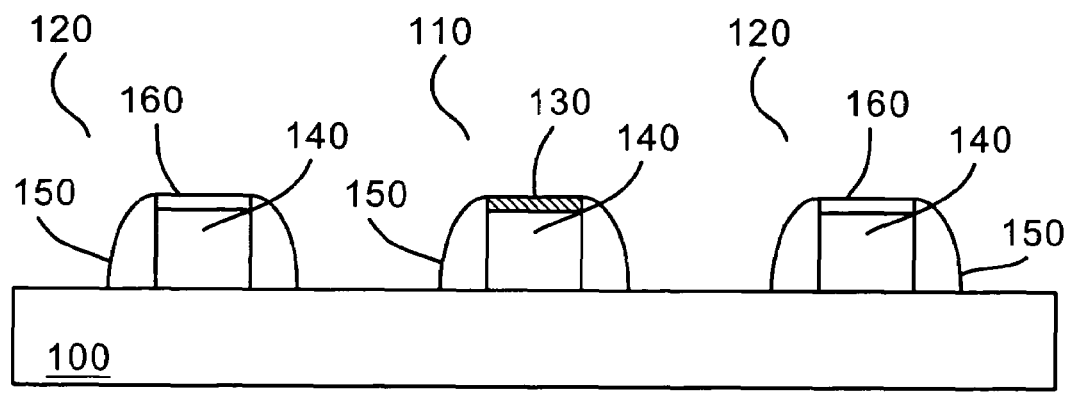
FIG. 1 illustrates a cross sectional type view of an apparatus in accordance with one embodiment of the present invention.

FIG. 1 illustrates a polysilicon resistor 110 according to one embodiment of the present invention. Polysilicon resistor 110 includes a silicide blocking layer 130 formed in a polysilicon line 140. As illustrated, the polysilicon resistor 110 may be formed on a substrate 100 and may include spacers 150. In some embodiments of the present invention, the silicide blocking layer 130 may be silicon nitride, silicon oxide, or silicon carbide, as further discussed below. The silicide blocking layer 130 may be at a shallow depth of less than about 100 nm.

FIG. 1 also illustrates devices 120, where a silicide layer 160 is desired on the top surface of the polysilicon line 140. Devices 120 may be interconnects or transistors, for example. The devices 120 of FIG. 1 may include a variety of other structures not illustrated for simplicity, including sources and drains, well regions, and others. As illustrated, the invention may provide a polysilicon resistor 110 having a silicide blocking layer 130 and devices 120 having a silicide layer 160 integrated on the same substrate.

Figure 2:
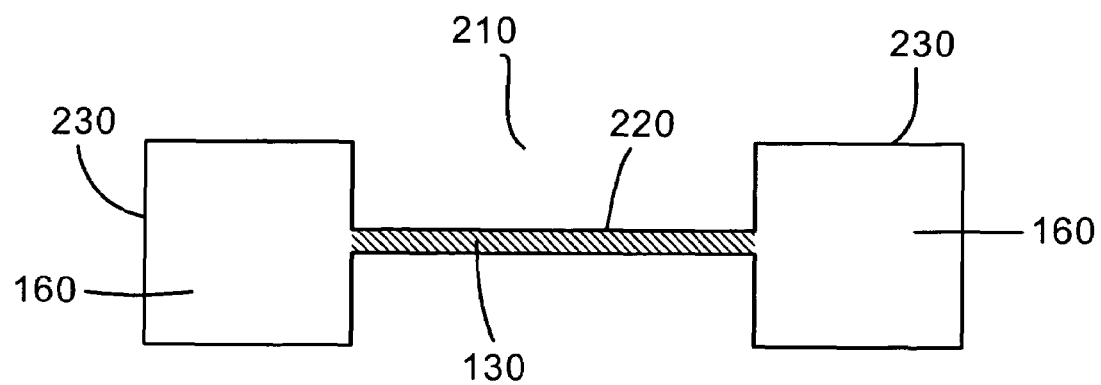
FIG. 2 illustrates a top down type view of an apparatus in accordance with one embodiment of the present invention.

FIG. 2 illustrates a top down view of a polysilicon resistor structure 210 according to one embodiment of the present invention, including a line portion 220 and landing pads 230. The line portion 220 may be resistive and may include a silicide blocking layer 130. The landing pads 230 may include a silicide layer 160 and may provide electrical contact locations for metal interconnect layers (not shown). In one embodiment of the present invention, the resistive line portion may not extend to the landing pads. In such an embodiment, interconnects (not shown) having a silicide layer may extend from the line portion to the landing pads. In another embodiment, the resistance of the resistive line portion may be controlled by its length. FIG. 2 also illustrates the notion that a silicide blocking layer 130 and a silicide layer 160 may be integrated into the same polysilicon structure.

Figure 3A:
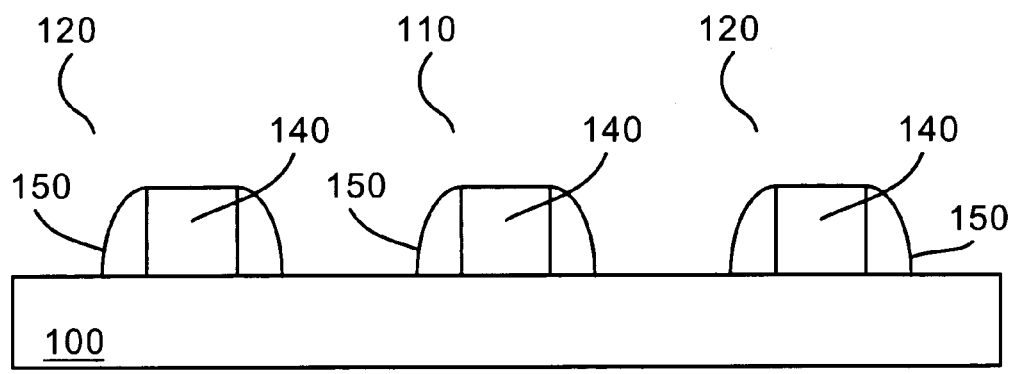
FIGS. 3A-3E illustrate cross sectional type views of a method in accordance with one embodiment of the present invention.

FIGS. 3A-3E illustrate a method, according to one embodiment of the invention, of forming the polysilicon resistor 110 or the polysilicon resistor structure 210 described above. Referring first to FIG. 3A, polysilicon lines 140 and spacers 150 may be formed on substrate 100 by known methods. In one embodiment, the substrate 100 may include monocrystalline silicon. In another embodiment, the substrate 100 may include silicon on insulator. The substrate 100 may also include other layers or structures (not shown) that comprise insulative, conductive, or semiconductive materials, such as sources, drains, wells, gate dielectrics, isolation structures, and others. The spacers 150 may consist of a nitride, or a combination of a nitride and an oxide.

Figure 3B:
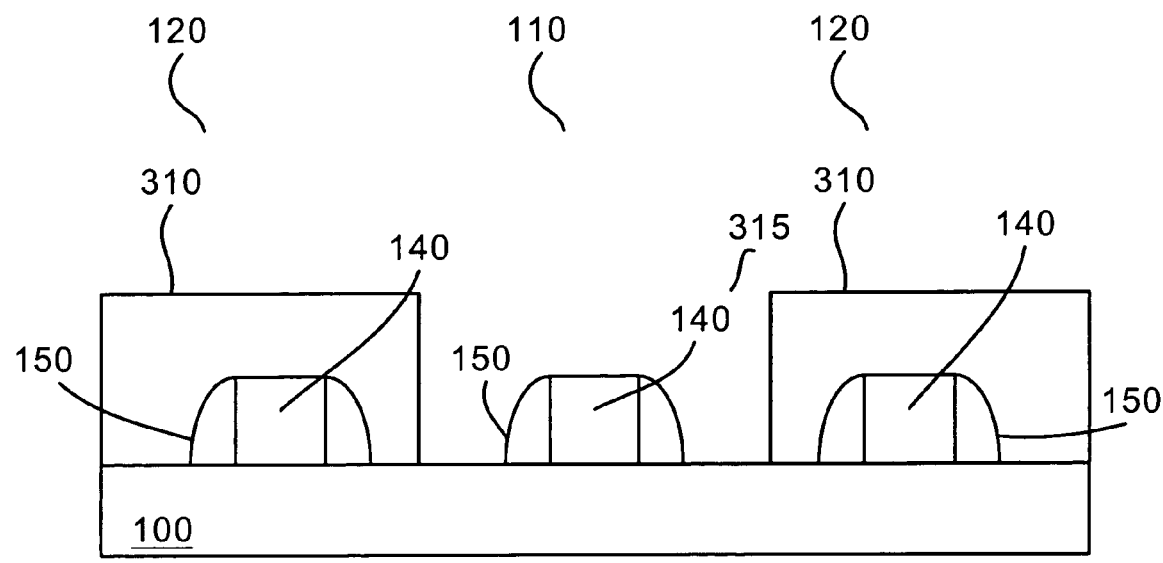

The method may continue by forming a patterned photoresist layer 310, as shown in FIG. 3B. Forming the patterned photoresist layer 310 may include well known photoresist deposition, masking and exposing, and developing techniques to have openings 315 that selectively expose polysilicon lines 140 that are to be polysilicon resistors 110 while covering those polysilicon lines 140 that are to be devices 120 having a silicide layer. With reference to FIG. 2, in another embodiment of the invention, the patterned photoresist layer 310 may also expose portions of a polysilicon structure where a silicide blocking layer 130 is desired, while covering those portions where a silicide layer 160 is desired (e.g., the patterned photoresist layer 310 may cover landing pads 230 and expose the line portion 220 of a polysilicon resistor structure 210).

Figure 3C:
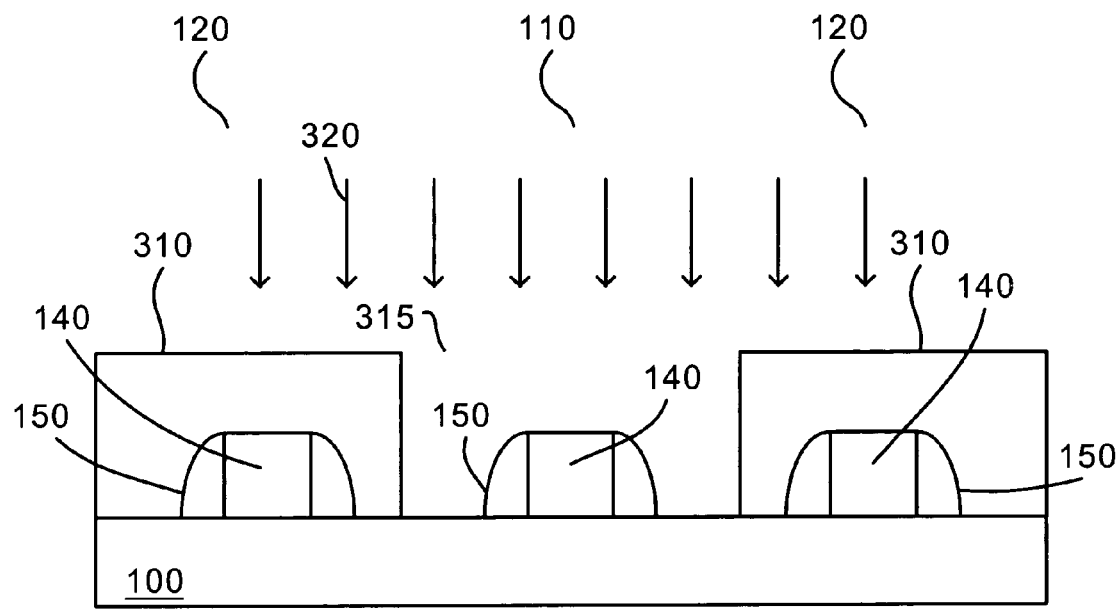

Referring now to FIG. 3C, polysilicon resistors 110 may be selectively exposed to an atomic implant 320 while devices 120 may be protected from the implant by the patterned photoresist layer 310. In embodiments of the invention, the atomic implant 320 may be an implant of nitrogen, oxygen, or carbon. The atomic implant 320 may be a low energy (less than about 10 keV), high dose (greater than about $1 \times 10^{15}$ atoms/cm$^2$) implant so a high concentration of atoms will be implanted at the surface of an exposed polysilicon line 140. In one embodiment, the implant energy may be in the range of about 0.5 to 5 keV and the implant concentration may be in the range of about $1 \times 10^{15}$ to $1 \times 10^{16}$ atoms/cm$^2$. In one embodiment, the angle of implant may be 15 degrees (relative to a line normal to the substrate surface), while in other embodiments, an implant angle of 0 to 45 degrees may be used.

In another embodiment of the invention, an additional process of implanting the polysilicon line 140 exposed by opening 315 with a dopant (e.g., boron), to adjust the resistance of the polysilicon line 140 may be completed prior to or after atomic implant 320 by known methods. In this way, the dopant implant may take advantage of the patterned photoresist layer 310 without requiring another, similar photoresist layer during the device fabrication.

Figure 3D:
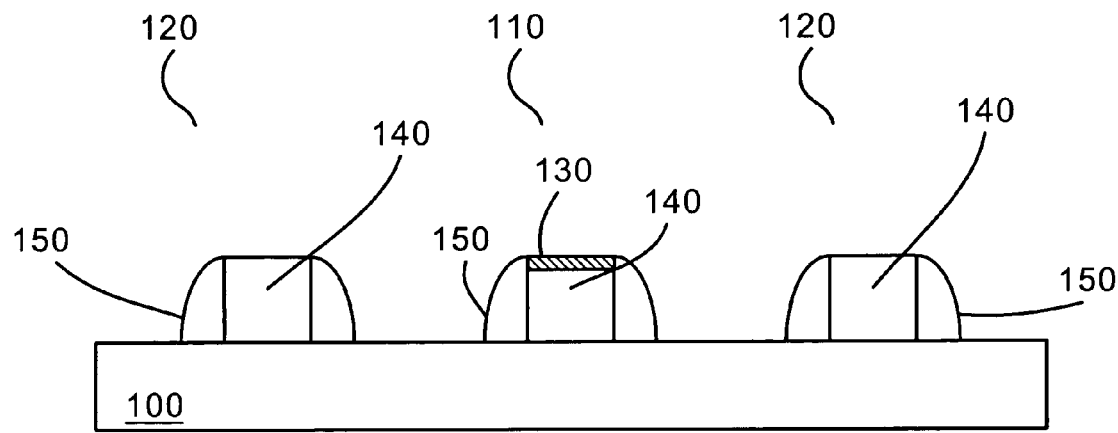

The method may continue with removal of the patterned photoresist layer 310 and a subsequent anneal to form a silicide blocking layer 130 as illustrated in FIG. 3D. In embodiments of the present invention, the silicide blocking layer 130 may be formed by reacting the polysilicon with the atomic implant to form silicon nitride, silicon oxide, or silicon carbide. The anneal may be performed at a temperature above about 700° C. In one embodiment, the anneal may be at a temperature of about 700° C. for about 1 hour. In another embodiment, the anneal may be at a temperature of about 900° C. for about 10 seconds. In some embodiments, the anneal may be a spike anneal where the anneal is performed at a high temperature for a very short time. In one embodiment a spike anneal temperature greater than about 1050° C. may be used.

In one embodiment of the invention, the devices 120 may include a transistor requiring a dopant activation anneal. In such an embodiment, the dopant activation anneal and silicide blocking layer anneal may be accomplished in one step.

Figure 3E:
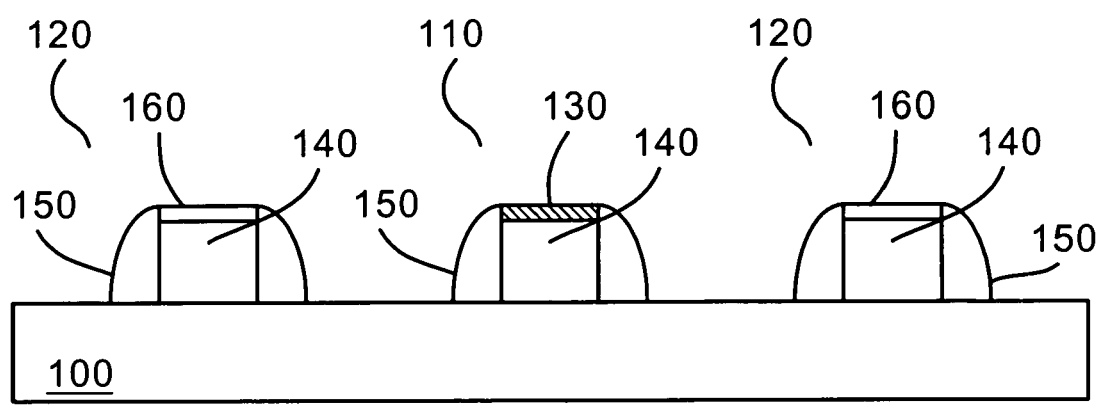

Referring to FIG. 3E, a silicide layer 160 may be formed on the devices 120. The silicide layer 160 may be formed using known methods by a metal deposition, anneal, and wet etch removal of the deposited metal that does not form a silicide. In embodiments of the invention, the silicide layer 160 may include nickel silicide, titanium silicide, or cobalt silicide formed by deposition of nickel, titanium, or cobalt, respectively. In another embodiment, the silicide may "self align," reacting only with exposed silicon, producing a "salicide." As illustrated in FIG. 3E, the silicide blocking layer 130 may block a conductive suicide from forming on the polysilicon resistor 110, while the devices 120, having exposed polysilicon lines 140, form a silicide layer 160.

In one embodiment, the suicide blocking layer 130 may have consumed the available silicon at the top surface of the polysilicon line 140, leaving no available polysilicon for reaction with the deposited metal during anneal. The metal may then be substantially removed during the wet etch process. In another embodiment, the silicide blocking layer 130 may inhibit the formation of high quality, low resistance silicide such that while some silicide forms the polysilicon resistor 110 maintains its resistive properties. For example, the silicide formed in this case may be discontinuous and thereby have a high electrical resistance. In another embodiment, the metal for silicide formation may be nickel and the silicide blocking layer 130 may inhibit the formation of lower resistance NiSi phase during the silicide anneal, leaving the silicide in a higher resistance Ni$_2$Si phase.

Figure 4:
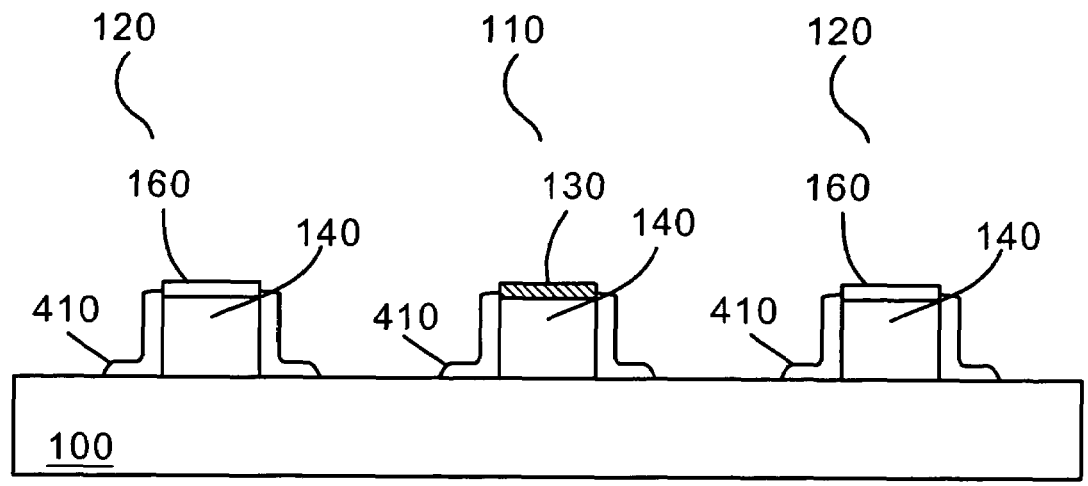
FIG. 4 illustrates a cross sectional type view of an apparatus in accordance with one embodiment of the present invention.

Referring now to FIG. 4, an apparatus is illustrated in accordance with another embodiment of the present invention. FIG. 4 illustrates L-shaped spacers 410 that do not extend to the upper edge of the polysilicon lines 140. In some embodiments, the relatively wide spacers 150 illustrated in FIG. 1 may similarly only extend to a point below the upper edge of the polysilicon lines 140. As illustrated in FIG. 4, the silicide blocking layer 130 may extend below the top of the L-shaped spacers 410 to protect the top surface and top corners of the polysilicon line 140 from silicide formation.

Figure 5:
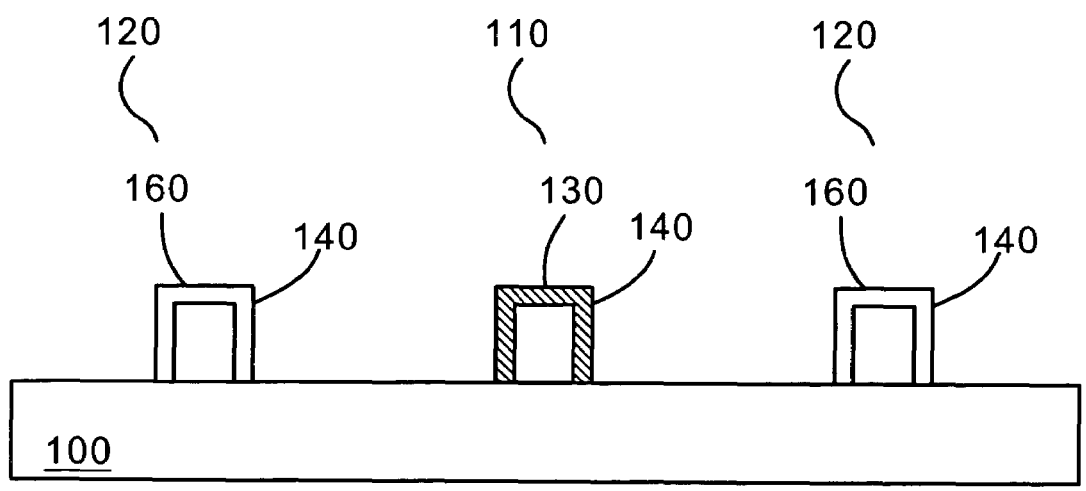
FIG. 5 illustrates a cross sectional type view of an apparatus in accordance with one embodiment of the present invention.

FIG. 5 also illustrates an apparatus of the present invention. As illustrated in FIG. 5, the polysilicon lines 140 may not have associated spacers. The silicide blocking layer may then be formed on 3 sides of the polysilicon line 140 of the polysilicon resistor 110 to protect the polysilicon resistor 110 from silicide formation as previously described.

The polysilicon resistors 110 of FIGS. 4 and 5 may be formed by the methods described above and illustrated in FIGS. 3A-3E. In particular, an angled atomic implant as discussed with reference to FIG. 3C may be used to implant atoms on the corners and sides of the polysilicon resistors 110 of FIGS. 4 and 5. In embodiments of the invention, angles of about 15 to 45 degrees may be used.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method for forming a polysilicon resistor using a polysilicon structure comprising:
    forming the polysilicon structure and a second polysilicon structure on a substrate surface;
    forming a patterned layer over the polysilicon structure and the second polysilicon structure that exposes at least a portion of the polysilicon structure;
    implanting atoms into at least the portion of the polysilicon structure;
    annealing the polysilicon structure to form a silicide blocking layer that is not itself a silicide and blocks the formation of any such silicide in at least the portion of the polysilicon structure; and
    forming a silicide layer on the second polysilicon structure, wherein the silicide blocking layer prevents silicide from forming in at least the portion of the polysilicon structure.

2. The method of claim 1, wherein the atoms comprise at least one of nitrogen, oxygen, or carbon.

3. The method of claim 1, wherein implanting the atoms includes implanting the atoms at an energy below about 10 keV and a dose above about $1\times10^{15}$ atoms/cm$^2$.

4. The method of claim 1, wherein implanting the atoms includes implanting the atoms at an angle less than about 45 degrees.

5. The method of claim 1, wherein annealing the second plurality of the polysilicon lines includes annealing at a temperature of about 900 for about 10 seconds.

6. The method of claim 1, wherein annealing the second plurality of the polysilicon lines includes a spike anneal at a temperature above about 1050° C.

7. The method of claim 1, further comprising: forming a transistor using the second polysilicon structure.

8. The method of claim 7, wherein forming the transistor includes a dopant activation anneal, and the dopant activation anneal and annealing the polysilicon structure are completed in one anneal step.

9. A method for forming a polysilicon resistor using a polysilicon structure comprising:

forming the polysilicon structure on a substrate surface;

implanting atoms into a first region of the polysilicon structure;

annealing the polysilicon structure to form a silicide blocking layer that is not itself a silicide and blocks the formation of any such silicide in the first region of the polysilicon structure; and forming a silicide layer on a second region of the polysilicon structure, wherein the silicide blocking layer prevents silicide from forming on the first region of the polysilicon structure.

10. The method of claim 9, wherein the atoms comprise at least one of nitrogen, oxygen, or carbon.

11. The method of claim 9, including implanting the atoms at an energy below about 10 keV and a dose above about $1\times10^{15}$ atoms/cm$^2$.

12. The method of claim 9, including annealing the polysilicon resistor at a temperature above about 700° C.

* * * * *